(12) United States Patent
Sakuma et al.

(10) Patent No.: US 11,374,141 B2
(45) Date of Patent: Jun. 28, 2022

(54) SOLAR CELL ASSEMBLY AND METHOD OF MANUFACTURING SOLAR CELL

(71) Applicant: PANASONIC CORPORATION, Osaka (JP)

(72) Inventors: Toshiyuki Sakuma, Osaka (JP); Kazuya Murata, Osaka (JP); Masayuki Katagiri, Kanagawa (JP); Akiyoshi Ogane, Osaka (JP); Akinao Kitahara, Shimane (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 16/833,138

(22) Filed: Mar. 27, 2020

(65) Prior Publication Data
US 2020/0313020 A1 Oct. 1, 2020

(30) Foreign Application Priority Data

Mar. 29, 2019 (JP) .............................. JP2019-065208

(51) Int. Cl.
*H01L 31/0747* (2012.01)
*H01L 31/18* (2006.01)
(Continued)

(52) U.S. Cl.
CPC .. *H01L 31/0747* (2013.01); *H01L 31/022425* (2013.01); *H01L 31/022466* (2013.01);
(Continued)

(58) Field of Classification Search
CPC ................. H01L 31/0747; H01L 31/05; H01L 31/022425; H01L 31/022466; H01L 31/042; H01L 31/046–0465
See application file for complete search history.

(56) References Cited

U.S. PATENT DOCUMENTS 5,391,235 A * 2/1995 Inoue ................ H01L 31/03921
136/244
2010/0000597 A1 1/2010 Cousins
(Continued)

FOREIGN PATENT DOCUMENTS

JP 4036880 B2 1/2008
JP 2015-126171 A 7/2015
(Continued)

*Primary Examiner* — Lindsey A Bernier
(74) *Attorney, Agent, or Firm* — McDermott Will & Emery LLP

(57) ABSTRACT

A solar cell assembly includes a plurality of solar cells and an inter-cell region provided between adjacent ones of the solar cells included in the plurality of solar cells. Each of the solar cells and the inter-cell region includes: a semiconductor substrate having a first conductivity type and having a first main surface and a second main surface that face away from each other; a first amorphous semiconductor layer having a second conductivity type and being provided on a first main surface side of the semiconductor substrate; an insulating layer provided on part of the first amorphous semiconductor layer; and a first transparent conductive film provided on the first amorphous semiconductor layer so as to cover the insulating layer. In a plan view of the solar cell assembly, the insulating layer is provided along the inter-cell region and partially overlapping the inter-cell region.

8 Claims, 9 Drawing Sheets

(51) Int. Cl.
  *H01L 31/0224* (2006.01)
  *H01L 31/0368* (2006.01)
  *H01L 31/042* (2014.01)
  *H01L 31/046* (2014.01)
  *H01L 31/0463* (2014.01)
  *H01L 31/05* (2014.01)
  *H01L 31/0465* (2014.01)

(52) U.S. Cl.
  CPC ........ *H01L 31/0368* (2013.01); *H01L 31/042* (2013.01); *H01L 31/046* (2014.12); *H01L 31/0463* (2014.12); *H01L 31/0465* (2014.12); *H01L 31/05* (2013.01); *H01L 31/182* (2013.01)

(56) References Cited

U.S. PATENT DOCUMENTS

| | | | | |
|---|---|---|---|---|
| 2011/0220189 A1* | 9/2011 | Yamamuka | ........... | H01L 31/076 |
| | | | | 136/255 |
| 2011/0304002 A1* | 12/2011 | Niira | ................. | H01L 31/0463 |
| | | | | 257/443 |
| 2015/0340528 A1* | 11/2015 | Alberi | ................. | H01L 31/0475 |
| | | | | 136/244 |
| 2019/0259885 A1* | 8/2019 | Yoshikawa | ....... | H01L 31/02167 |

FOREIGN PATENT DOCUMENTS

| | | | | |
|---|---|---|---|---|
| JP | 5763159 B2 | 8/2015 | | |
| JP | 2015-198142 A | 11/2015 | | |
| WO | WO-2018084159 A1 * | 5/2018 | ........... | H01L 31/028 |

\* cited by examiner

SOLAR CELL ASSEMBLY AND METHOD OF MANUFACTURING SOLAR CELL

CROSS REFERENCE TO RELATED APPLICATION

This application claims the benefit of priority of Japanese Patent Application Number 2019-065208, filed on Mar. 29, 2019, the entire content of which is hereby incorporated by reference.

TECHNICAL FIELD

The present disclosure relates to a solar cell assembly including a plurality of solar cells, and to a method of manufacturing a solar cell.

BACKGROUND ART

Solar cells have been under development for some time as photoelectric conversion devices that convert light energy into electrical energy. Solar cells have the ability to convert the unlimited light from the sun directly into electricity. Solar cells are also clean, with less impact on the environment than power generated using fossil fuels. For these reasons, solar cells hold promise as a novel source of energy.

A solar cell includes a semiconductor substrate, an amorphous semiconductor layer formed on the semiconductor substrate, and a transparent conductive film formed on the amorphous semiconductor layer. The solar cell is formed by segmenting a solar cell assembly that includes a plurality of solar cells.

Japanese Unexamined Patent Application Publication No. 2015-198142 (Patent Literature 1; "PTL 1" hereinafter) discloses a technique for manufacturing a solar cell. According to this technique, first, the transparent conductive film of a solar cell assembly is partially removed, and the regions from which the transparent conductive film has been removed are irradiated with a laser to create segmenting grooves in the amorphous semiconductor layer and the semiconductor substrate. The solar cell assembly is then split to form individual solar cells.

However, the technique disclosed in PTL 1 has a problem in that partially removing the transparent conductive film also damages the amorphous semiconductor layer and the semiconductor substrate, which causes a drop in the characteristics of the solar cell.

Accordingly, an object of the present disclosure is to provide a solar cell assembly and a method of manufacturing a solar cell which can suppress a drop in the characteristics of the solar cell.

SUMMARY

To achieve the aforementioned object, a solar cell assembly according to one aspect of the present disclosure is a solar cell assembly including a plurality of solar cells and an inter-cell region provided between adjacent ones of the solar cells included in the plurality of solar cells. Each of the solar cells and the inter-cell region includes: a semiconductor substrate having a first conductivity type and having a first main surface and a second main surface that face away from each other; a first amorphous semiconductor layer having a second conductivity type and being provided on a first main surface side of the semiconductor substrate; an insulating layer provided on part of the first amorphous semiconductor layer; and a first transparent conductive film provided on the first amorphous semiconductor layer so as to cover the insulating layer. In a plan view of the solar cell assembly, the insulating layer is provided along the inter-cell region and partially overlapping the inter-cell region.

To achieve the aforementioned object, a solar cell assembly according to one aspect of the present disclosure is a solar cell assembly including a plurality of solar cells and an inter-cell region provided between adjacent ones of the solar cells included in the plurality of solar cells. Each of the solar cells and the inter-cell region includes: a semiconductor substrate having a first conductivity type and having a first main surface and a second main surface that face away from each other; a tunnel oxide layer provided on a first main surface side of the semiconductor substrate; an insulating layer provided on part of the tunnel oxide layer; and a polycrystal silicon layer having the first conductivity type and being provided on the tunnel oxide layer so as to cover the insulating layer. In a plan view of the solar cell assembly, the insulating layer is provided along the inter-cell region and partially overlapping the inter-cell region.

To achieve the aforementioned object, a method of manufacturing a solar cell according to one aspect of the present disclosure includes: forming a first amorphous semiconductor layer having a second conductivity type on a first main surface side of a semiconductor substrate, the semiconductor substrate having a first conductivity type and including the first main surface and a second main surface that face away from each other; forming an insulating layer having a band shape on the first amorphous semiconductor layer; forming a solar cell assembly by forming a first transparent conductive film on the first amorphous semiconductor layer so as to cover the insulating layer; forming a groove in the solar cell assembly along the insulating layer, in a plan view of the solar cell assembly; and splitting the solar cell assembly along the groove.

According to the present disclosure, a solar cell assembly and a method of manufacturing a solar cell which can suppress a drop in the characteristics of the solar cell can be provided.

BRIEF DESCRIPTION OF THE DRAWINGS

The figures depict one or more implementations in accordance with the present teaching, by way of examples only, not by way of limitations. In the figures, like reference numerals refer to the same or similar elements.

DETAILED DESCRIPTION

Figure 1:
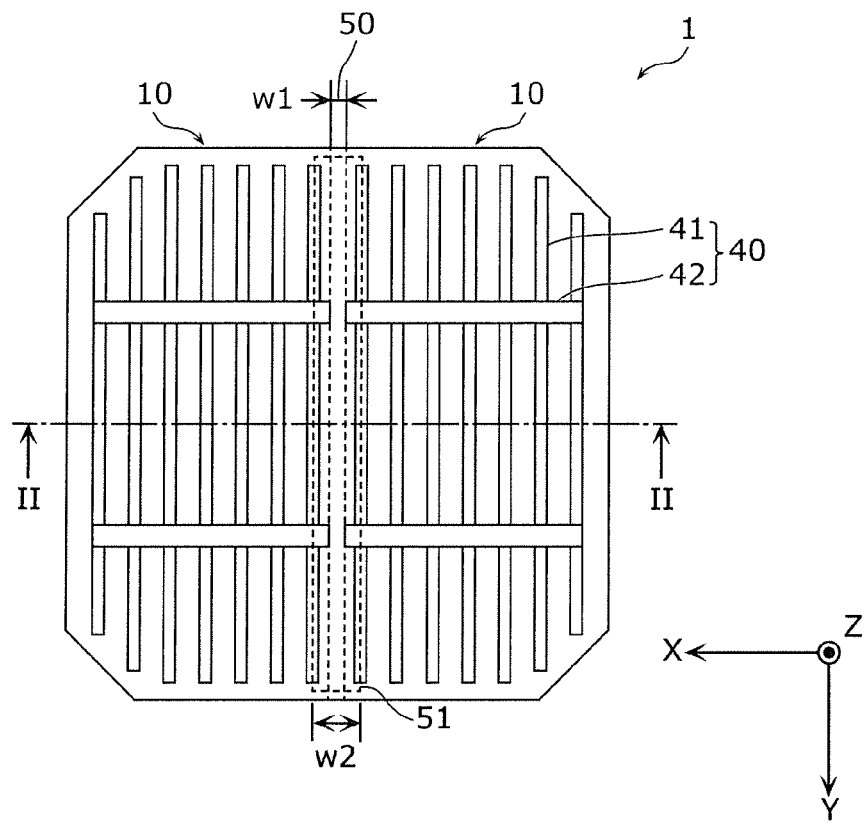
FIG. 1 is a plan view of a solar cell assembly according to Embodiment 1.

Exemplary embodiments of the present disclosure will be described in detail hereinafter with reference to the drawings. The following exemplary embodiments describe specific examples of the present disclosure. As such, the numerical values, shapes, materials, constituent elements, arrangements of constituent elements, connection states, processes, orders of processes, and the like in the following embodiments are merely examples, and are not intended to limit the present disclosure. Thus, of the constituent elements in the following embodiments, constituent elements not denoted in the independent claims, which express the broadest interpretation of the present disclosure, will be described as optional constituent elements.

Note also that the drawings are schematic diagrams, and are not necessarily exact illustrations. Configurations that are substantially the same are given the same reference signs in the drawings, and redundant descriptions may be omitted or simplified.

The term "approximately" is intended to cover elements or concepts that can be considered substantially equivalent. For example, the term "approximately orthogonal" is intended to include both elements that are perfectly orthogonal as well as elements that are considered to be substantially orthogonal. In the present specification, the term "approximately" means that manufacturing error, dimensional tolerances, and the like are included.

Furthermore, in the drawings, a Z-axis direction is, for example, a direction perpendicular to a light-receiving surface of a solar cell. An X-axis direction and a Y-axis direction are directions which are both orthogonal to each other and orthogonal to the Z-axis direction. For example, in the following embodiments, the phrase "viewed in plan view" refers to viewing from the Z-axis direction. Additionally, in the following embodiments, the phrase "viewed cross-sectionally" refers to viewing a cross-section obtained by cutting the solar cell along a plane orthogonal to the light-receiving surface of the solar cell (e.g., a plane defined by the Z-axis and the X-axis) from a direction approximately orthogonal to that cross-section.

Embodiment 1

1-1. Configuration of Solar Cell Assembly

A solar cell assembly according to the present embodiment will be described with reference to FIGS. 1 to 4.

Figure 2:
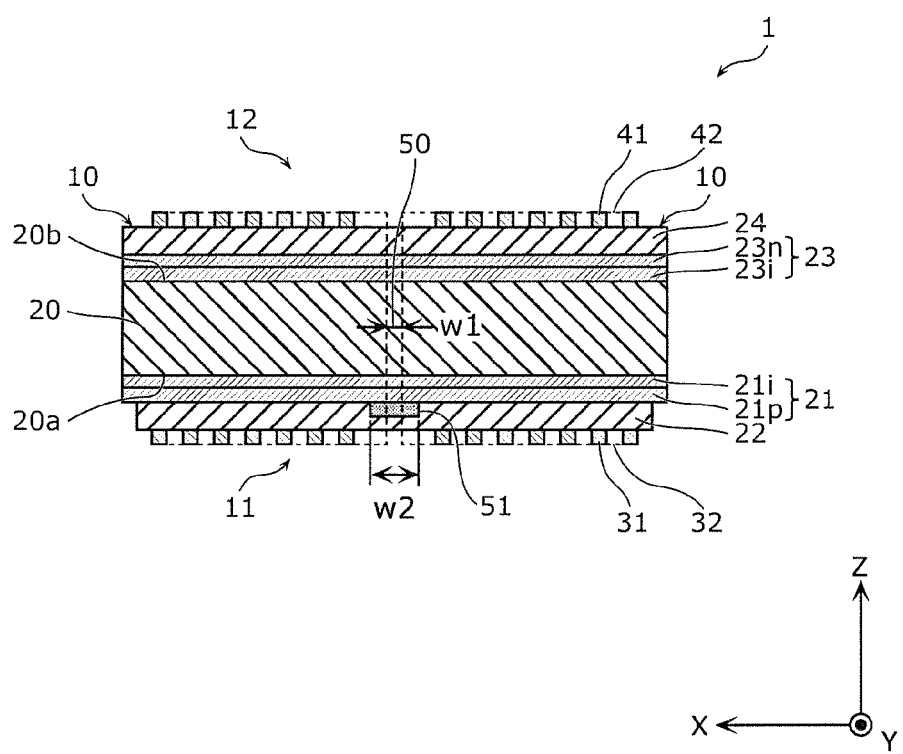
FIG. 2 is a cross-sectional view illustrating the solar cell assembly according to Embodiment 1 cut along line II-II indicated in FIG. 1.

FIG. 1 is a plan view of solar cell assembly 1 according to Embodiment 1. FIG. 2 is a cross-sectional view illustrating solar cell assembly 1 cut along line II-II indicated in FIG. 1.

Solar cell assembly 1 is a mother substrate in which a plurality of thin films are formed on a semiconductor substrate cut from an ingot. As illustrated in FIG. 1, solar cell assembly 1 is approximately rectangular in shape when viewed in plan view. Solar cell assembly 1 has a shape obtained by removing the corners from a square that is 125 mm long on each side. However, the shape of solar cell assembly 1 is not limited to being approximately rectangular.

As illustrated in FIGS. 1 and 2, solar cell assembly 1 includes a plurality of solar cells 10, and inter-cell region 50 provided between solar cells 10, of the plurality of solar cells 10, that are adjacent to each other. In the present embodiment, solar cell assembly 1 includes two approximately rectangular solar cells 10. Inter-cell region 50 is provided between the two solar cells 10, i.e., along a boundary line that divides solar cell assembly 1 in two.

Solar cell 10 is, for example, a heterojunction-type solar cell, and has a semiconductor pn junction for a basic structure. Solar cells 10 are formed by segmenting solar cell assembly 1 at inter-cell region 50.

When solar cell assembly 1 is viewed in plan view, inter-cell region 50 extends in a direction orthogonal to the direction in which the plurality of solar cells 10 are arranged (i.e., extends in the Y-axis direction). Part of inter-cell region 50 is removed in the process of segmenting solar cell assembly 1. The other parts of inter-cell region 50 are not removed, and constitute parts of solar cells 10 following the segmentation of solar cell assembly 1.

As illustrated in FIG. 2, solar cell assembly 1 includes semiconductor substrate 20, p-type semiconductor layer 21, insulating layer 51, first transparent conductive film 22, and first collecting electrode 30. P-type semiconductor layer 21 is provided on first main surface 20a side of semiconductor substrate 20. Insulating layer 51 is provided on part of p-type semiconductor layer 21. First transparent conductive film 22 is provided on p-type semiconductor layer 21 so as to cover insulating layer 51. First collecting electrode is provided on first transparent conductive film 22. Solar cell assembly 1 also includes n-type semiconductor layer 23, second transparent conductive film 24, and second collecting electrode 40. N-type semiconductor layer 23 is provided on second main surface 20b side of semiconductor substrate 20. Second transparent conductive film 24 is provided on n-type semiconductor layer 23. Second collecting electrode 40 is provided on second transparent conductive film 24.

Insulating layer 51 has a band shape, and extends along inter-cell region 50 (see FIG. 1). Insulating layer 51 is a carrier movement suppression layer that suppresses carrier movement between first amorphous semiconductor layer 21p of p-type semiconductor layer 21 and first transparent conductive film 22 when solar cell 10 functions as a photoelectric conversion device. Insulating layer 51 will be described in further detail later.

Semiconductor substrate 20 is tabular in shape, and has first main surface 20a and second main surface 20b, which face away from each other. In the present embodiment, first main surface 20a is located on a rear surface 11 side of semiconductor substrate 20, whereas second main surface 20b is located on a light-receiving surface 12 side of solar cell 10. Note that light-receiving surface 12 is a surface on which more than 50% of light incident on solar cell 10 is incident when a solar cell module is constructed using solar cell 10.

Semiconductor substrate 20 is a crystalline silicon substrate, and is, for example, an n-type single-crystal silicon substrate. However, semiconductor substrate 20 is not limited to a single-crystal silicon substrate (an n-type single-crystal silicon substrate or a p-type single-crystal silicon substrate), and may instead be a crystalline silicon substrate such as a polycrystalline silicon substrate. The following will describe a case where semiconductor substrate 20 is an n-type single-crystal silicon substrate. Note that the present specification may also refer to "n-type" as "first conductivity type" and "p-type" as "second conductivity type". For example, semiconductor substrate 20 is a semiconductor substrate having the first conductivity type.

Semiconductor substrate 20 has an approximately rectangular planar shape. Semiconductor substrate 20 is from 30 to 300 μm thick, for example, and is desirably no thicker than 150 μm. Non-planar shapes, called a "textured structure", formed by disposing a plurality of pyramid shapes in a two-dimensional arrangement, may be formed on at least one of first main surface 20a and second main surface 20b of semiconductor substrate 20.

P-type semiconductor layer 21 has i-type amorphous semiconductor layer 21i (an intrinsic amorphous semiconductor layer) and first amorphous semiconductor layer 21p. I-type amorphous semiconductor layer 21i and first amorphous semiconductor layer 21p are layered in that order on first main surface 20a of semiconductor substrate 20. The "layering" referred to here means layering in the negative Z-axis direction.

I-type amorphous semiconductor layer 21i is a passivation layer disposed between semiconductor substrate 20 and first amorphous semiconductor layer 21p. I-type amorphous semiconductor layer 21i is constituted by amorphous silicon having a dopant content of less than $1 \times 10^{19}$ cm$^{-3}$. The passivation layer is not limited to an i-type amorphous semiconductor layer, and may instead be formed from an oxide semiconductor layer, a nitride semiconductor layer, or the like.

First amorphous semiconductor layer 21p is a semiconductor layer having a conductivity type different from that of semiconductor substrate 20. For example, if semiconductor substrate 20 is of the first conductivity type, first amorphous semiconductor layer 21p is of the second conductivity type. First amorphous semiconductor layer 21p is constituted by, for example, amorphous silicon having a p-type dopant (e.g., boron (B)) content of from $5 \times 10^{19}$ cm$^{-3}$ to $5 \times 10^{22}$ cm$^{-3}$, and desirably from $5 \times 10^{20}$ cm$^{-3}$ to $5 \times 10^{21}$ cm$^{-3}$.

N-type semiconductor layer 23 has i-type amorphous semiconductor layer 23i (an intrinsic amorphous semiconductor layer) and second amorphous semiconductor layer 23n. I-type amorphous semiconductor layer 23i and second amorphous semiconductor layer 23n are layered in that order on second main surface 20b of semiconductor substrate 20. The "layering" referred to here means layering in the positive Z-axis direction.

I-type amorphous semiconductor layer 23i is a passivation layer disposed between semiconductor substrate 20 and second amorphous semiconductor layer 23n. I-type amorphous semiconductor layer 23i is constituted by amorphous silicon having a dopant content of less than $1 \times 10^{19}$ cm$^{-3}$.

Second amorphous semiconductor layer 23n is a semiconductor layer having the same conductivity type as semiconductor substrate 20. For example, if semiconductor substrate 20 is of the first conductivity type, second amorphous semiconductor layer 23n is also of the first conductivity type. Second amorphous semiconductor layer 23n is constituted by, for example, amorphous silicon having an n-type dopant (e.g., phosphorous (P), arsenic (As), or the like) content of no less than from $5 \times 10^{19}$ cm$^{-3}$.

First transparent conductive film 22 and second transparent conductive film 24 are transparent conductive layers (TCO films) constituted by a transparent conductive material, for example. First transparent conductive film 22 is provided in a region further inside than the outer periphery of semiconductor substrate 20 (see (b) in FIG. 3). Additionally, when viewed cross-sectionally from the direction in which the band shape of insulating layer 51 extends (the Y-axis direction), first transparent conductive film 22 covers the entire insulating layer 51. Although FIG. 2 illustrates the surface of first transparent conductive film 22 covering insulating layer 51 as being formed flat, it should be noted that first transparent conductive film 22 may be formed so that the part corresponding to insulating layer 51 protrudes (see (a) in FIG. 3).

It is desirable that the transparent conductive film be constituted containing at least one metal oxide having a polycrystalline structure, e.g., indium oxide ($In_2O_3$), zinc oxide (ZnO), tin oxide ($SnO_2$), titanium oxide ($TiO_2$), and the like. These metal oxides may be doped with a dopant such as tin (Sn), zinc (Zn), tungsten (W), antimony (Sb), titanium (Ti), aluminum (Al), cerium (Ce), or gallium (Ga), and ITO in which $In_2O_3$ is doped with Sn is particularly desirable, for example. The dopant concentration can be set to from 0 to 20 weight %.

First collecting electrode 30 is provided on p-type semiconductor layer 21, and is an electrode that collects a received light charge (holes) produced in a light-receiving region on semiconductor substrate 20. First collecting electrode 30 includes, for example, a plurality of finger electrodes 31 formed in straight lines in a direction orthogonal to a direction in which tab lines (described later) extend, and a plurality of busbar electrodes 32 connected to finger electrodes 31 and formed in straight lines in a direction orthogonal to finger electrodes 31.

Second collecting electrode 40 is provided on n-type semiconductor layer 23, and is an electrode that collects a received light charge (electrons) produced in the light-receiving region on semiconductor substrate 20. Second collecting electrode 40 includes, for example, a plurality of finger electrodes 41 formed in straight lines in a direction orthogonal to a direction in which the tab lines extend, and a plurality of busbar electrodes 42 connected to finger electrodes 41 and formed in straight lines in a direction orthogonal to finger electrodes 41. Taking light-blocking properties, splitting properties, and material conservation into account, it is desirable that busbar electrodes 32 and 42 not be formed in the aforementioned inter-cell region 50.

Additionally, taking light-blocking properties, splitting properties, and material conservation into account, first collecting electrode 30 may be constituted by the plurality of finger electrodes 31, without including busbar electrodes 32. Likewise, second collecting electrode 40 may be constituted by the plurality of finger electrodes 41, without including busbar electrodes 42.

Insulating layer 51 provided between first amorphous semiconductor layer 21p and first transparent conductive film 22 will be described here with reference to FIGS. 1 to 3. Insulating layer 51 is provided in order to suppress carrier movement and reduce carrier recombination, which arise with ease at the ends of side surfaces (end parts on the sides) of solar cell 10 and between first amorphous semiconductor layer 21p and first transparent conductive film 22.

Figure 3:
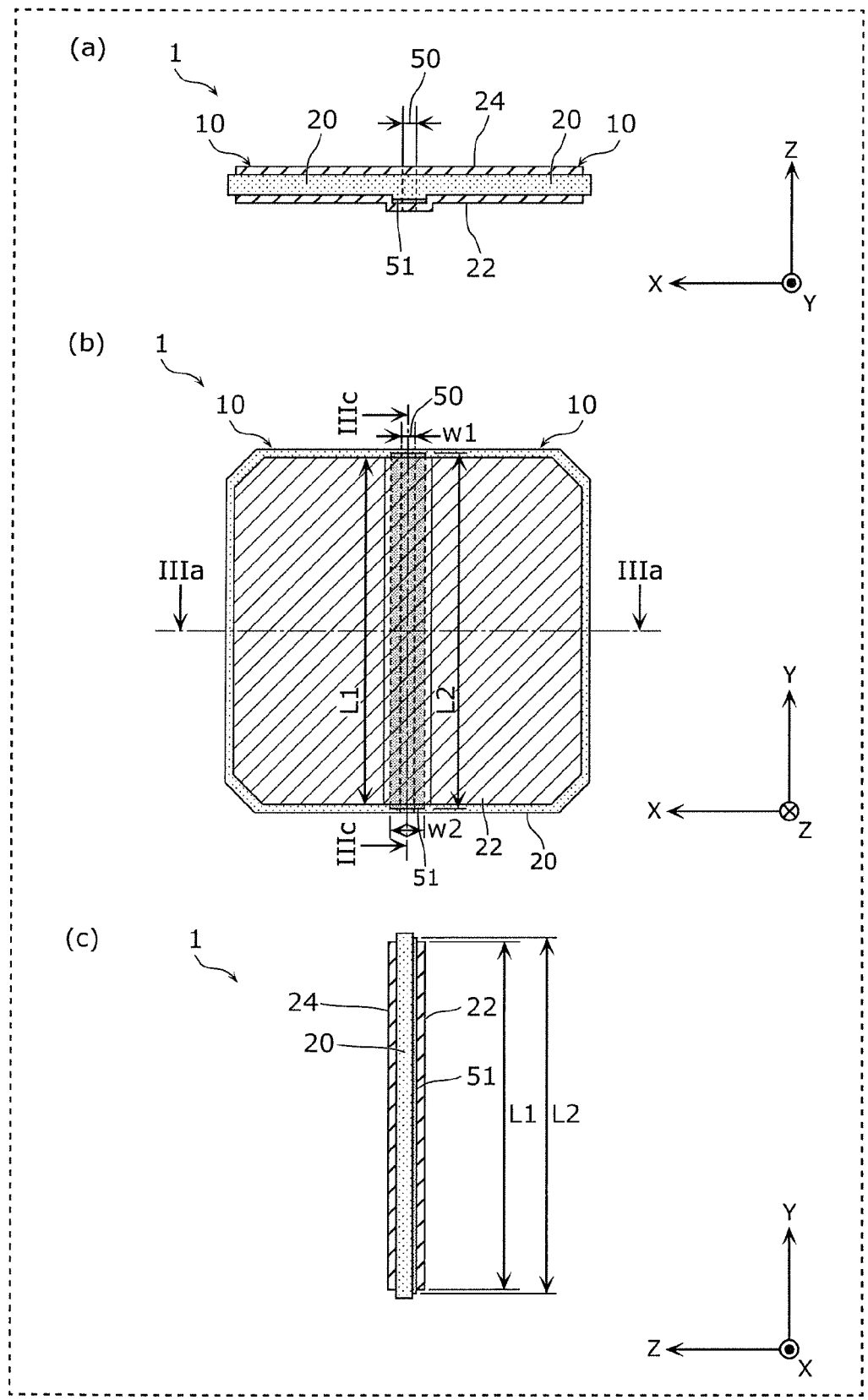
FIG. 3 is cross-sectional views and a bottom view of a solar cell assembly according to Embodiment 1.

FIG. 3 is cross-sectional views and a bottom view of solar cell assembly 1. (a) in FIG. 3 is a cross-sectional view illustrating solar cell assembly 1, illustrated in (b) of FIG. 3, cut along line IIIc-IIIc. (b) in FIG. 3 is a bottom view of solar cell assembly 1. (c) in FIG. 3 is a cross-sectional view illustrating solar cell assembly 1, illustrated in (b) of FIG. 3, cut along line IIIc-IIIc. Note that p-type semiconductor layer 21, n-type semiconductor layer 23, first collecting electrode 30, and second collecting electrode 40 are not illustrated in FIG. 3.

As illustrated in FIG. 1 and (b) of FIG. 3, when solar cell assembly 1 is viewed in plan view, insulating layer 51 is provided along inter-cell region 50. Specifically, insulating layer 51 extends in a straight line in a direction orthogonal to the direction in which the plurality of solar cells 10 are arranged (the Y-axis direction).

Additionally, when solar cell assembly 1 is viewed in plan view, insulating layer 51 is provided so as to partially overlap with inter-cell region 50. Specifically, width w2 of the band-shaped insulating layer 51 is greater than width w1 of inter-cell region 50, and insulating layer 51 is disposed so as to contain inter-cell region 50 in terms of a width direction (the X-axis direction). In other words, insulating layer 51 extends over outer sides of inter-cell region 50 with respect to the width direction.

Additionally, as illustrated in (b) and (c) of FIG. 3, length L2 of the band-shaped insulating layer 51 is longer than length L1 of first transparent conductive film 22 in the direction orthogonal to the direction in which the plurality of solar cells 10 are arranged (the Y-axis direction). Having length L2 be longer than length L1 provides a structure in which part of insulating layer 51 covered by first transparent conductive film 22 protrudes outside first transparent conductive film 22. This makes it possible to provide insulating layer 51 in the entire region between first amorphous semiconductor layer 21p and first transparent conductive film 22, which is in a planned splitting area. Additionally, when solar cell assembly 1 is viewed from the side where rear surface 11 is located, the position of insulating layer 51 can be recognized using a camera or the like.

Insulating layer 51 is formed from SiN, $SiO_2$, $TiO_2$, $AlO_3$, or a resin material. Epoxy, urethane, silicone, an acryl, polyester, polyimide, polyamide, fluorine resin, and the like can be given as examples of the resin material. The resin material may contain an insulating pigment (e.g., insulative carbon black, $TiO_2$, $AlO_3$, or the like).

When insulating layer 51 is SiN, $SiO_2$, $TiO_2$, or $AlO_3$, insulating layer 51 is from 1 nm to 200 nm thick, desirably from 10 nm to 100 nm thick, and further desirably from 10 nm to 50 nm thick. When insulating layer 51 is a resin material, insulating layer 51 is from 0.1 μm to 1 mm thick, desirably from 1 μm to 50 μm thick, and further desirably from 5 μm to 30 μm thick.

When the material of insulating layer 51 is SiN, $SiO_2$, $TiO_2$, or $AlO_3$, insulating layer 51, which is a thin film, is transparent. In the present embodiment, insulating layer 51 is provided on first main surface 20a side, and thus light passing through insulating layer 51 can be reflected by rear surface sealant 172 or rear surface protective member 190 and used in photoelectric conversion.

When the material of insulating layer 51 is a resin, insulating layer 51 can be colored. For example, when insulating layer 51 is a colored resin containing white, insulating layer 51 can be more easily recognized, which makes it possible to improve productivity. Additionally, when insulating layer 51 is a white resin, light can be reflected on first main surface 20a side and used in photoelectric conversion.

In solar cell assembly 1 according to the present embodiment, insulating layer 51 is provided between first amorphous semiconductor layer 21p and first transparent conductive film 22 in inter-cell region 50. According to this configuration, in solar cell 10 manufactured by segmenting solar cell assembly 1, insulating layer 51 can be provided both at the ends of side surfaces of solar cell 10 and between first amorphous semiconductor layer 21p and first transparent conductive film 22. This makes it possible to suppress the aforementioned carrier movement when solar cell 10 functions as a photoelectric conversion device. A drop in the characteristics of solar cell 10 can therefore be suppressed.

Additionally, a removal region need not be formed in first transparent conductive film 22 as in the related art, which makes it possible to suppress situations where first amorphous semiconductor layer 21p and semiconductor substrate 20 are damaged. This makes it possible to suppress a drop in the characteristics of solar cell 10.

Although the foregoing describes an example in which insulating layer 51 is provided on first main surface 20a side of semiconductor substrate 20, it should be noted that the location of insulating layer 51 is not limited to first main surface 20a side. Insulating layer 51 may be provided between second amorphous semiconductor layer 23n and second transparent conductive film 24 on second main surface 20b side. For example, when the material of insulating layer 51 is SiN, $SiO_2$, $TiO_2$, or $AlO_3$, insulating layer 51, which is a thin film, is transparent, and this configuration therefore makes it possible to suppress situations where incident light is blocked by insulating layer 51. Additionally, when insulating layer 51 is a resin material and is colored, carrier movement directly below insulating layer 51 can be suppressed.

1-2. Configuration of Solar Cell

The configuration of solar cell 10 obtained by segmenting solar cell assembly 1 will be described next.

Figure 4:
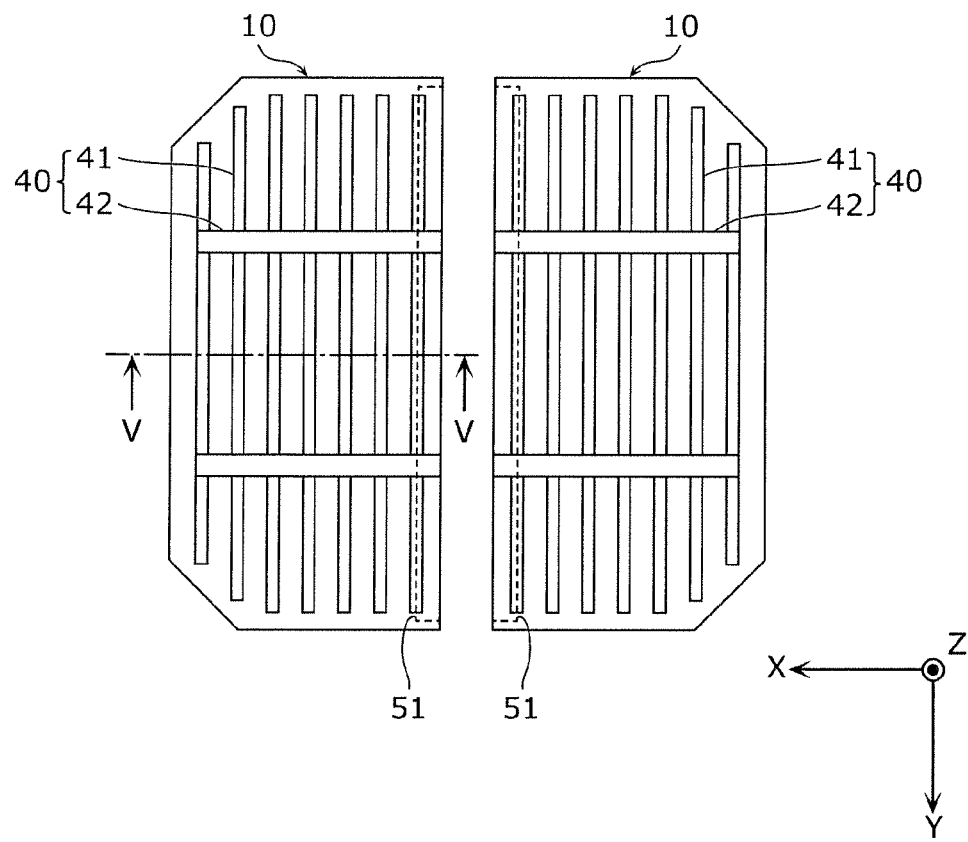
FIG. 4 is a plan view of a plurality of solar cells constituting the solar cell assembly illustrated in FIG. 1.
Figure 5:
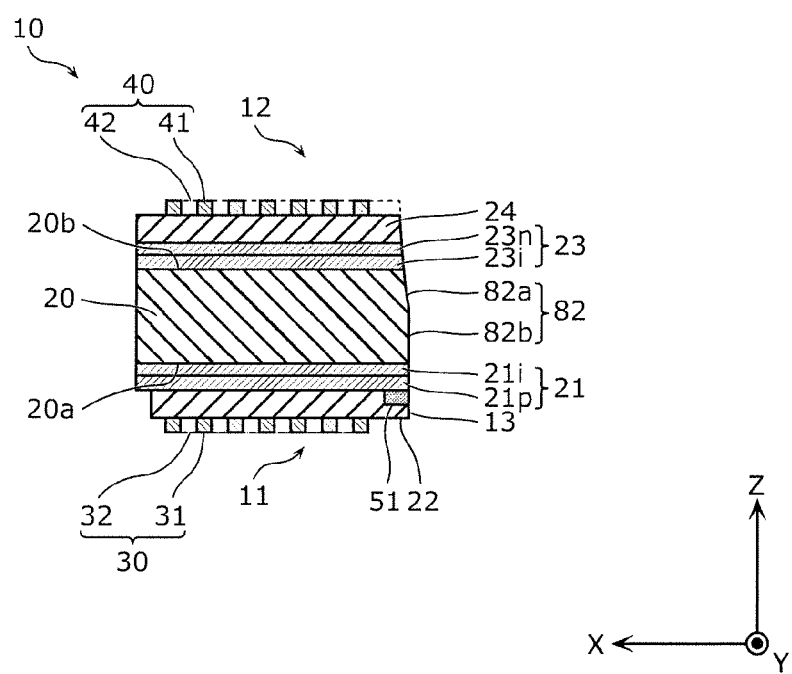
FIG. 5 is a cross-sectional view illustrating the solar cell shown in FIG. 4 cut along line V-V.

FIG. 4 is a plan view of a plurality of solar cells 10 constituting solar cell assembly 1 illustrated in FIG. 1. FIG. 5 is a cross-sectional view illustrating solar cell 10 shown in FIG. 4 cut along line V-V. Note that FIG. 4 illustrates two solar cells 10.

As illustrated in FIG. 4, solar cell 10 is formed by segmenting solar cell assembly 1. The shape of solar cell 10, when viewed in plan view, is approximately rectangular.

As illustrated in FIG. 5, solar cell 10 includes semiconductor substrate 20, p-type semiconductor layer 21, insulating layer 51, first transparent conductive film 22, and first collecting electrode 30. Semiconductor substrate 20 is of the first conductivity type. P-type semiconductor layer 21 is provided on first main surface 20a side of semiconductor substrate 20. Insulating layer 51 is provided on part of p-type semiconductor layer 21. First transparent conductive film 22 is provided on p-type semiconductor layer 21 so as to cover insulating layer 51. First collecting electrode is provided on first transparent conductive film 22. P-type semiconductor layer 21 has i-type amorphous semiconductor layer 21i and first amorphous semiconductor layer 21p.

Solar cell 10 also includes n-type semiconductor layer 23, second transparent conductive film 24, and second collecting electrode 40. N-type semiconductor layer 23 is provided on second main surface 20b side of semiconductor substrate 20. Second transparent conductive film 24 is provided on n-type semiconductor layer 23. Second collecting electrode 40 is provided on second transparent conductive film 24. N-type semiconductor layer 23 has i-type amorphous semiconductor layer 23i and second amorphous semiconductor layer 23n.

Solar cell 10 has segmented surface 82 formed by segmenting solar cell assembly 1. Segmented surface 82 has notch surface 82a formed by a laser, and splitting surface 82b formed by splitting.

Insulating layer 51 is provided between first amorphous semiconductor layer 21p and first transparent conductive film 22. Insulating layer 51 is also provided on one end part 13 where, of the four ends of solar cell 10, segmented surface 82 is formed, and is exposed on splitting surface 82b. Furthermore, as illustrated in FIG. 4, when solar cell 10 is viewed in plan view, insulating layer 51 is provided along segmented surface 82 of solar cell 10. It is necessary that a width (distance in the X-axis direction) of insulating layer 51 be a distance no less than the mean free path of carriers in the X-axis direction of first amorphous semiconductor layer 21p, e.g., from 0.01 mm to 2 mm, more desirably from 0.05 mm to 1 mm, and further desirably from 0.1 mm to 0.5 mm.

In this manner, in solar cell 10, insulating layer 51 is provided between first amorphous semiconductor layer 21p and first transparent conductive film 22 at one end part 13 of solar cell 10. According to this configuration, carrier movement between first amorphous semiconductor layer 21p and first transparent conductive film 22 can be suppressed. This makes it possible to suppress a drop in the characteristics of solar cell 10. Additionally, because insulating layer 51 serves as a blocking layer, situations where contaminants enter at one end part 13 of solar cell 10 can be suppressed more than in a state where first transparent conductive film 22 is partially removed, as in the related art. This makes it possible to suppress a drop in the characteristics of solar cell 10.

1-3. Configuration of Solar Cell Module

The configuration of solar cell module 9 including a plurality of solar cells 10 will be described next.

Figure 6:
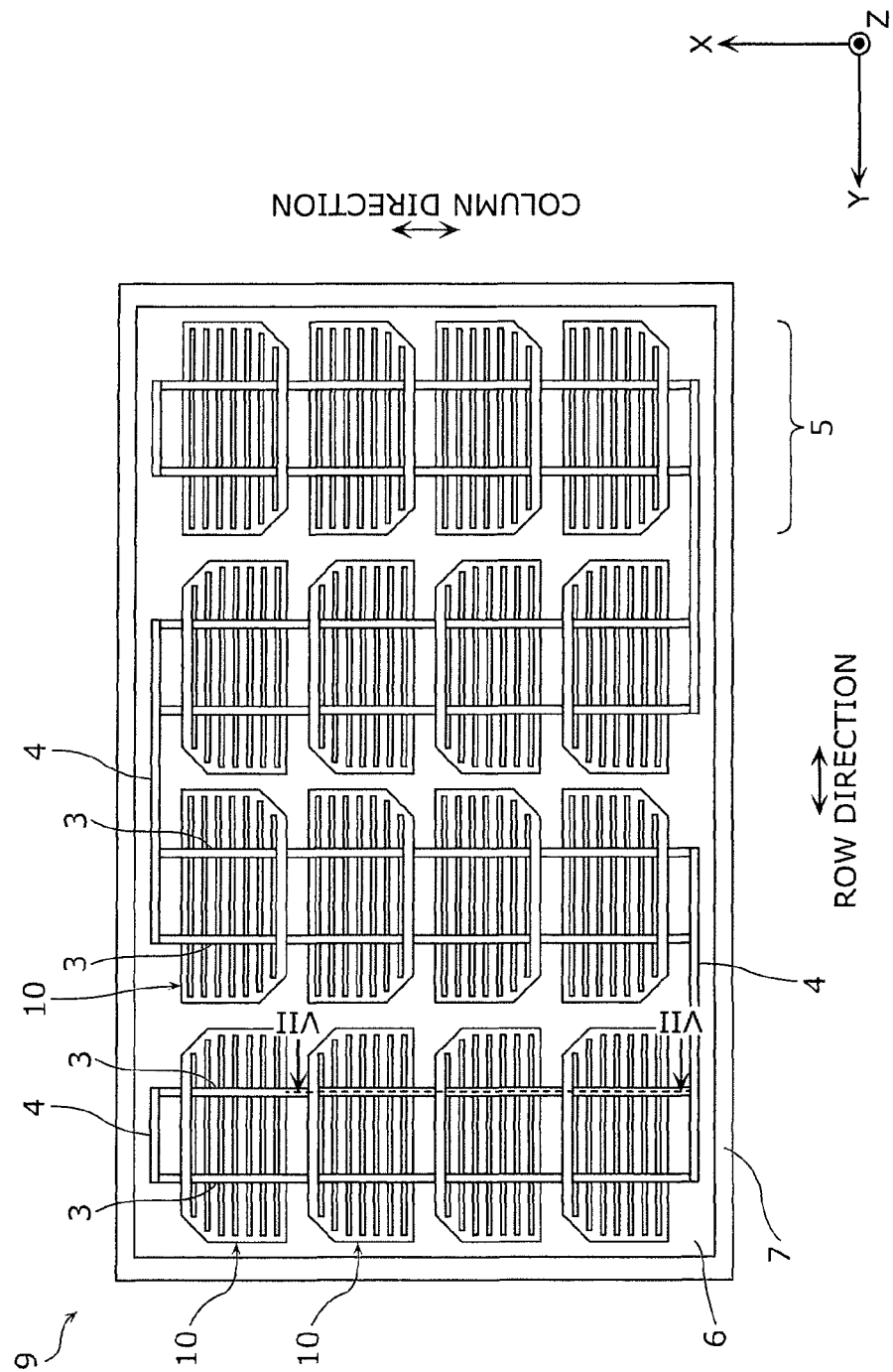
FIG. 6 is a plan view of a solar cell module including the solar cell illustrated in FIG. 4.

FIG. 6 is a plan view of solar cell module 9 including solar cells 10 illustrated in FIG. 4.

As illustrated in FIG. 6, solar cell module 9 includes panel 6 and frame body 7. Panel 6 includes a plurality of solar cells 10 and so on.

Panel 6 has a plate shape, and contains a plurality of solar cells 10, tab lines 3, and crossover lines 4. Frame body 7 is an outer frame member that surrounds an outer peripheral part of panel 6. Solar cells 10 are arranged in a matrix on a light-receiving surface of solar cell module 9. Tab lines 3 are long conductive wires that electrically connect solar cells 10 which are adjacent to each other in a column direction (the X-axis direction). The plurality of solar cells 10 connected in the column direction by tab lines 3 constitute solar cell string 5. Crossover lines 4 are wire members that electrically connect solar cell strings 5 to each other.

Figure 7:
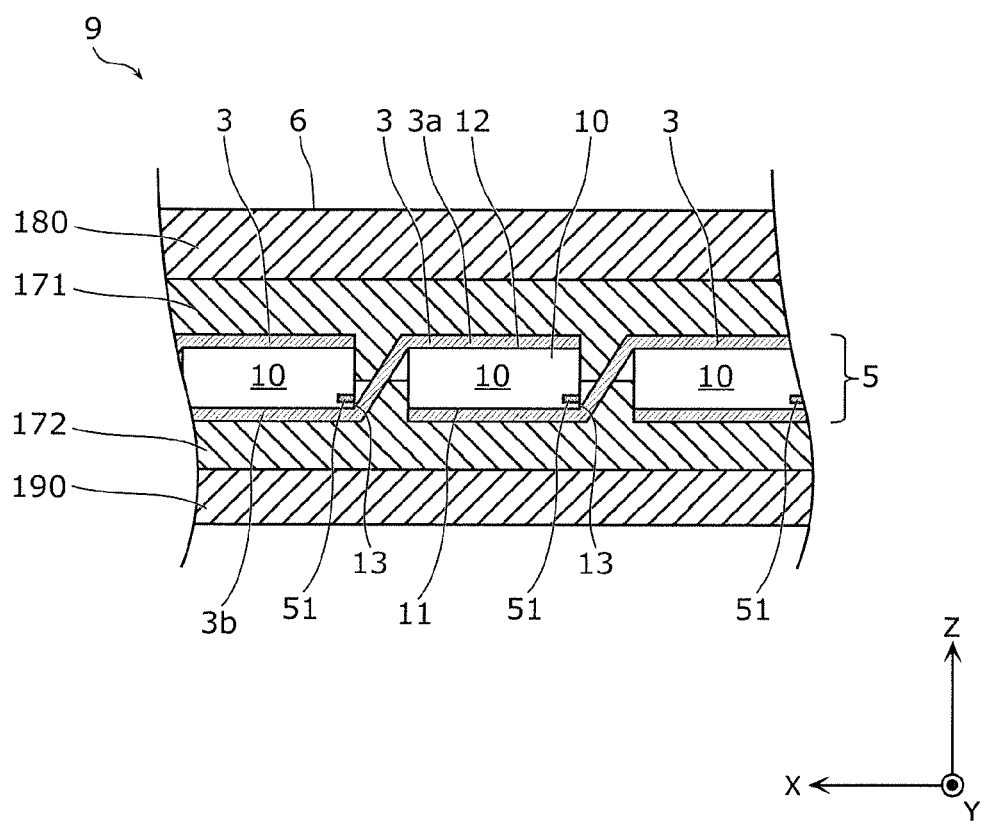
FIG. 7 is a cross-sectional view illustrating the solar cell module shown in FIG. 6 cut along line VII-VII.

FIG. 7 is a cross-sectional view illustrating solar cell module 9 shown in FIG. 6 cut along line VII-VII. Note that first collecting electrode 30 and second collecting electrode 40 are not illustrated in FIG. 7.

FIG. 7 illustrates solar cells 10 and tab lines 3, as well as light-receiving surface sealant 171, rear surface sealant 172, light-receiving surface protective member 180, and rear surface protective member 190 included in panel 6. As illustrated in FIG. 7, a bottom surface of one end part 3a of tab line 3 is joined to second collecting electrode 40 (not shown) provided on the light-receiving surface 12 side of solar cell 10. Additionally, a top surface of other end part 3b of tab line 3 is joined to first collecting electrode 30 (not shown) provided on the rear surface 11 side of solar cell 10. A received light charge produced by solar cell 10 is output to the exterior through first collecting electrode 30 and second collecting electrode 40, as well as tab lines 3 and crossover lines 4.

As described above, insulating layer 51 is provided on one end part 13 of solar cell 10. Solar cell string 5 is configured so that one end part 13 where insulating layer 51 is provided is close to tab line 3. As a result, leakage caused by one end part 13 of solar cell 10 making contact with tab line 3, for example, can be suppressed.

Note that insulating layer 51 is not limited to being provided on one end part 13 where segmented surface 82 is formed, and may be provided on another end part on the side opposite from where one end part 13 is located. In this case, in solar cell assembly 1 illustrated in (b) of FIG. 3, providing insulating layer 51 on both ends of solar cell 10 in the X-axis direction makes it possible to provide insulating layer 51 on the other end part of solar cell 10 as well.

1-4. Method of Manufacturing Solar Cell Assembly and Solar Cell

A method of manufacturing solar cell 10 according to the present embodiment will be described next with reference to FIGS. 8 to 10. An example in which two solar cells 10 are manufactured from solar cell assembly 1 will be described here.

Figure 8:
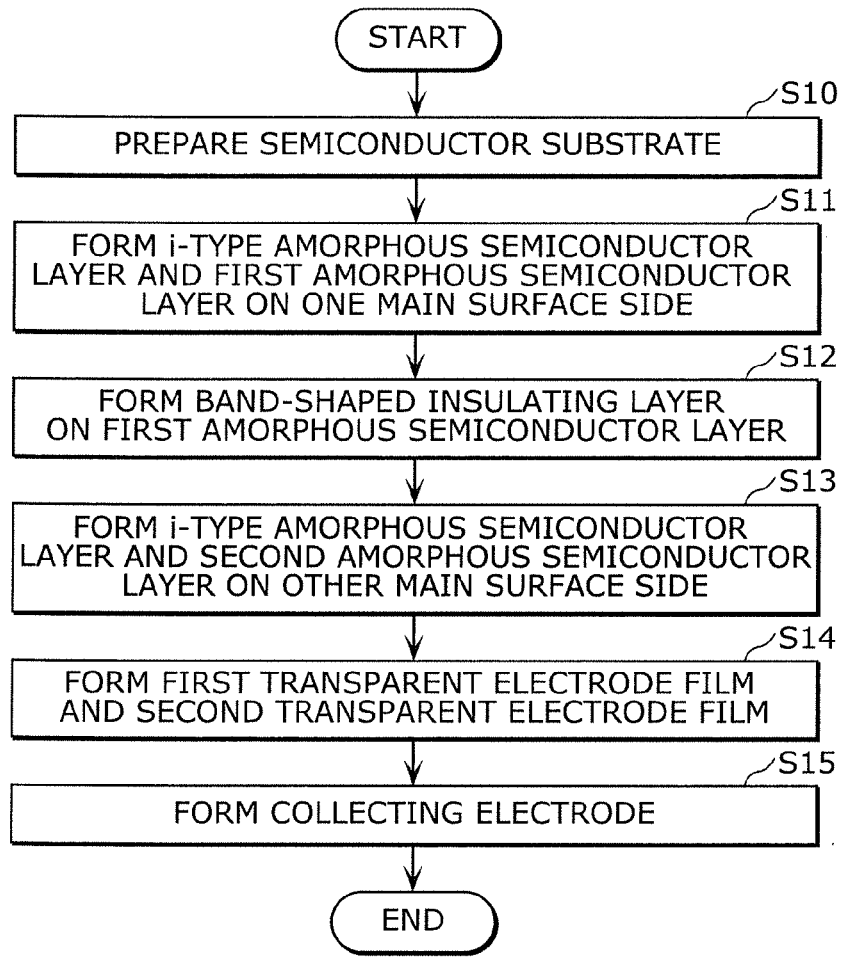
FIG. 8 is a flowchart illustrating a method of manufacturing a solar cell assembly according to Embodiment 1.

FIG. 8 is a flowchart illustrating a method of manufacturing solar cell assembly 1.

As illustrated in FIG. 8, first, a step of preparing semiconductor substrate 20 is carried out (S10). In the present embodiment, an n-type single-crystal semiconductor substrate is prepared as semiconductor substrate 20.

Next, a step of forming p-type semiconductor layer 21 on first main surface 20a of semiconductor substrate 20 is carried out (S11). Specifically, i-type amorphous semiconductor layer 21i is formed on first main surface 20a of semiconductor substrate 20 through a thin film forming method. Next, first amorphous semiconductor layer 21p is formed on i-type amorphous semiconductor layer 21i through a thin film forming method. Plasma-enhanced chemical vapor deposition (PECVD), catalytic chemical vapor deposition (Cat-CVD), sputtering, and the like can be given as examples of the thin film forming method.

Next, a step of forming insulating layer 51 on part of first amorphous semiconductor layer 21p (S12) is carried out. Insulating layer 51 is formed along inter-cell region 50 located between two solar cells 10. At this time, insulating layer 51 is formed so that width w2 of insulating layer 51 is greater than width w1 of inter-cell region 50. When insulating layer 51 is a metal material, a thin film forming method using a mask or the like is employed. However, when insulating layer 51 is a resin material, a method such as ink jet, jet dispenser, screen printing, offset printing, or the like is employed for insulating layer 51.

Next, a step of forming n-type semiconductor layer 23 on second main surface 20b of semiconductor substrate 20 is carried out (S13). Specifically, i-type amorphous semiconductor layer 23i is formed on second main surface 20b of semiconductor substrate 20 through a thin film forming method. Next, second amorphous semiconductor layer 23n is formed on i-type amorphous semiconductor layer 23i through a thin film forming method. Note that step S13 may be carried out before step S12.

Next, a step of forming first transparent conductive film 22 and second transparent conductive film 24 is carried out (S14). Specifically, first transparent conductive film 22 is formed on first amorphous semiconductor layer 21p, and second transparent conductive film 24 is formed on second amorphous semiconductor layer 23n. To be more specific, a transparent conductive oxide such as indium tin oxide (ITO) is formed on first amorphous semiconductor layer 21p and second amorphous semiconductor layer 23n through vapor deposition, sputtering, or the like. First transparent conductive film 22 is formed so that length L2 of first transparent conductive film 22 is shorter than length L1 of insulating layer 51, using a mask or the like.

Next, a step of forming first collecting electrode 30 and second collecting electrode 40 is carried out (S15). First collecting electrode 30 and second collecting electrode 40 are constituted by a low-resistance conductive material such as silver (Ag). For example, first collecting electrode 30 and second collecting electrode 40 are formed by screen-printing a resin-based conductive paste, in which a conductive filler such as silver particles are dispersed throughout a binder resin (e.g., silver paste or the like), in a predetermined pattern.

Solar cell assembly 1 is manufactured through these steps S10 to S15.

A method of manufacturing solar cell 10 will be described next with reference to FIG. 9.

Figure 9:
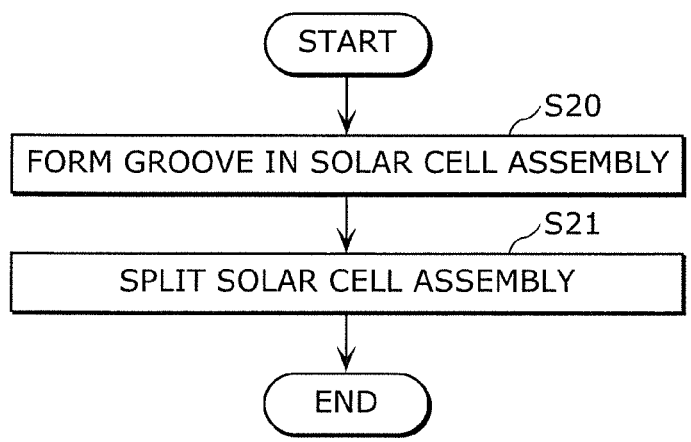
FIG. 9 is a flowchart illustrating a method of manufacturing a solar cell from the solar cell assembly according to Embodiment 1.

FIG. 9 is a flowchart illustrating a method of manufacturing solar cell 10 from solar cell assembly 1.

First, a step of forming groove 81 in solar cell assembly 1 is carried out (S20). This groove 81 is formed by, for example, irradiating the light-receiving surface 12 side of solar cell assembly 1 with a laser.

Figure 10:
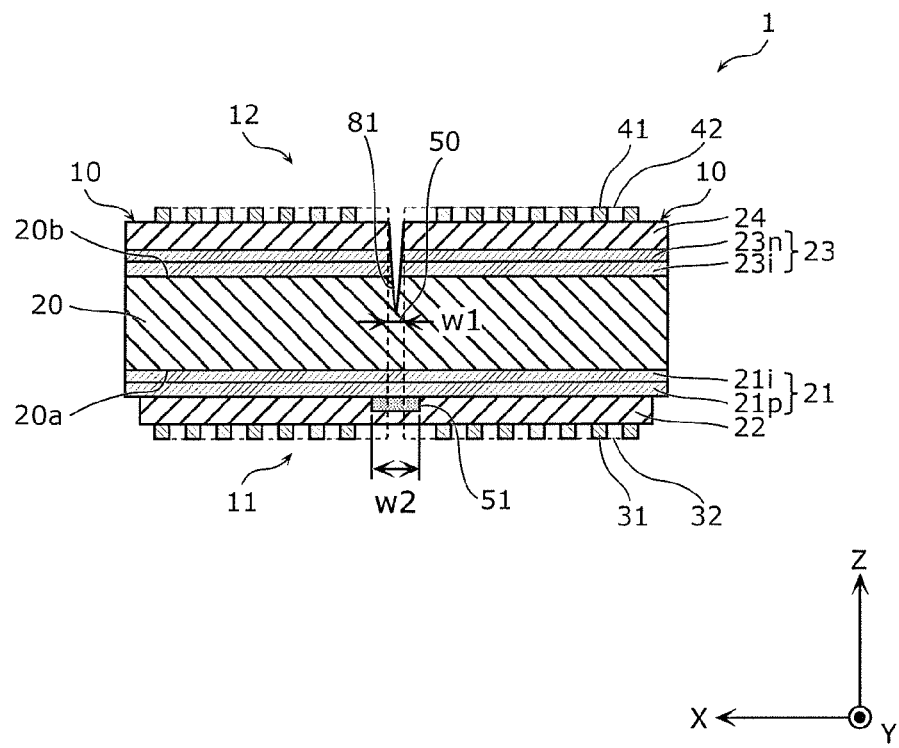
FIG. 10 is a cross-sectional view illustrating an example of a state in which a groove has been formed in the solar cell assembly according to Embodiment 1.

FIG. 10 is a cross-sectional view illustrating an example of a state in which groove 81 has been formed in solar cell assembly 1.

As illustrated in FIG. 10, groove 81 is formed along inter-cell region 50 and insulating layer 51. The laser is emitted toward second main surface 20b, where the pn junction of semiconductor substrate 20 is not formed. Groove 81 is therefore formed on second main surface 20b of semiconductor substrate 20. Processing second main surface 20b side with a laser in this manner makes it possible to suppress thermal damage caused by processing the pn junction side with a laser.

Groove 81 is formed to a depth at which groove 81 passes through second transparent conductive film 24 and n-type semiconductor layer 23 but does not pass through semiconductor substrate 20. The depth of groove 81 is no greater than 25%, no greater than 50%, or no greater than 75% of the thickness of semiconductor substrate 20. A width (length in the X-axis direction) of groove 81 when solar cell assembly 1 is viewed cross-sectionally is equal to width w1 of inter-cell region 50 and smaller than width w2 of insulating layer 51.

Next, a step of imparting bending stress on semiconductor substrate 20 to split semiconductor substrate 20 along groove 81 is carried out (S21). Two solar cells 10 are formed as a result of this splitting.

According to these steps, insulating layer 51 can be formed both at one end part 13 of solar cell 10 and between first amorphous semiconductor layer 21p and first transparent conductive film 22. This makes it possible to suppress carrier movement both at one end part 13 of solar cell 10 and between first amorphous semiconductor layer 21p and first transparent conductive film 22, which in turn makes it possible to suppress a drop in the characteristics of solar cell 10.

Although the foregoing example describes groove 81 as being formed from second main surface 20b side in step S20, groove 81 may instead be formed from first main surface 20a side.

Figure 11:
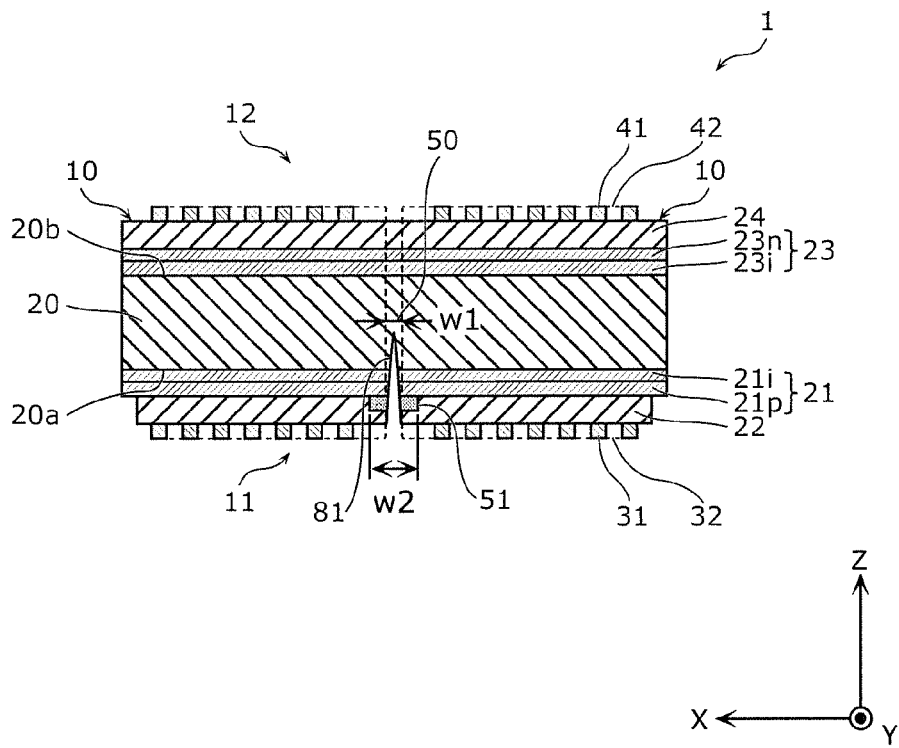
FIG. 11 is a cross-sectional view illustrating another example of a state in which a groove has been formed in the solar cell assembly according to Embodiment 1.

FIG. 11 is a cross-sectional view illustrating another example of a state in which groove 81 has been formed in solar cell assembly 1. FIG. 11 illustrates an example in which groove 81 has been formed from first main surface 20a side. Forming groove 81 through laser processing or the like carried out from first main surface 20a side in this manner makes it possible to reduce damage to light-receiving surface 12 and suppress a drop in the usable surface area of light-receiving surface 12. This method also makes it possible to suppress a drop in the characteristics of solar cell 10.

1-5. Effects, etc.

As described above, solar cell assembly 1 according to the present embodiment includes a plurality of solar cells 10, and inter-cell region 50 provided between adjacent ones of solar cells 10 included in the plurality of solar cells 10. Each of solar cells 10 and inter-cell region 50 includes: semiconductor substrate 20 having a first conductivity type and including first main surface 20a and second main surface 20b that face away from each other; first amorphous semiconductor layer 21p having a second conductivity type and being provided on first main surface 20a side of semiconductor substrate 20; insulating layer 51 provided on part of first amorphous semiconductor layer 21p; and first transparent conductive film 22 provided on first amorphous semiconductor layer 21p so as to cover insulating layer 51. In a plan view of solar cell assembly 1, insulating layer 51 is provided along inter-cell region 50 and partially overlapping inter-cell region 50.

According to this configuration, in solar cell 10 manufactured by segmenting solar cell assembly 1, insulating layer 51 can be provided both at the ends of side surfaces of solar cell 10 and between first amorphous semiconductor layer 21p and first transparent conductive film 22. This makes it possible to suppress carrier movement both at the ends of side surfaces of solar cell 10 and between first amorphous semiconductor layer 21p and first transparent conductive film 22 when solar cell 10 functions as a photoelectric conversion device. A drop in the characteristics of solar cell 10 can therefore be suppressed.

Additionally, a removal region need not be formed in first transparent conductive film 22 as in the related art, which makes it possible to suppress situations where first amorphous semiconductor layer 21p and semiconductor substrate 20 are damaged. This makes it possible to suppress a drop in the characteristics of solar cell 10.

Each of solar cells 10 and inter-cell region 50 may further include: second amorphous semiconductor layer 23n having the first conductivity type and being provided on second main surface 20b side of semiconductor substrate 20; and second transparent conductive film 24 provided on second amorphous semiconductor layer 23n.

According to this configuration, in solar cell 10 manufactured by segmenting solar cell assembly 1, a received light charge can be produced on both first main surface 20a side and second main surface 20b side of solar cell 10. A drop in the characteristics of solar cell 10 can therefore be suppressed.

Additionally, in a plan view of solar cell assembly 1, insulating layer 51 may be band-shaped.

According to this configuration, insulating layer 51 is disposed along inter-cell region 50, and thus insulating layer 51 can be provided at the ends of side surfaces of solar cell 10. This makes it possible to suppress carrier movement both at the ends of side surfaces of solar cell 10 and between first amorphous semiconductor layer 21p and first transparent conductive film 22 when solar cell 10 functions as a photoelectric conversion device. A drop in the characteristics of solar cell 10 can therefore be suppressed.

Additionally, width w2 of insulating layer 51, which is band-shaped, may be greater than width w1 of inter-cell region 50.

According to this configuration, insulating layer 51 can be reliably provided at the ends of side surfaces of solar cell 10. This makes it possible to suppress carrier movement both at the ends of side surfaces of solar cell 10 and between first amorphous semiconductor layer 21p and first transparent conductive film 22 when solar cell 10 functions as a photoelectric conversion device. A drop in the characteristics of solar cell 10 can therefore be suppressed.

Additionally, length L2 of insulating layer 51, which is band-shaped, may be greater than length L1 of first transparent conductive film 22.

According to this configuration, part of insulating layer 51 covered by first transparent conductive film 22 can be caused to protrude outside first transparent conductive film 22. This makes it possible to provide insulating layer 51 between first amorphous semiconductor layer 21p and first transparent conductive film 22 in inter-cell region 50. Additionally, when solar cell assembly 1 is viewed from the side where rear surface 11 is located, the position of insulating layer 51 can be recognized using a camera or the like, which makes it possible to improve the productivity of solar cell 10.

Additionally, when viewed from a direction in which insulating layer 51 extends in a band shape, first transparent conductive film 22 may completely cover insulating layer 51.

According to this configuration, insulating layer 51 and first transparent conductive film 22 can be provided in close contact at the ends of side surfaces of solar cell 10. This makes it possible to increase the adhesion between first amorphous semiconductor layer 21p and first transparent conductive film 22, which makes it possible to suppress carrier movement both at the ends of side surfaces of solar cell 10 and between first amorphous semiconductor layer 21p and first transparent conductive film 22. A drop in the characteristics of solar cell 10 can therefore be suppressed.

A method of manufacturing solar cell 10 according to the present embodiment includes: forming first amorphous semiconductor layer 21p having a second conductivity type on first main surface 20a side of semiconductor substrate 20, semiconductor substrate 20 having a first conductivity type and including first main surface 20a and second main surface 20b that face away from each other; forming insulating layer 51 having a band shape on first amorphous semiconductor layer 21p; forming solar cell assembly 1 by forming first transparent conductive film 22 on first amorphous semiconductor layer 21p so as to cover insulating layer 51; forming groove 81 in solar cell assembly 1 along insulating layer 51, in a plan view of solar cell assembly 1; and splitting solar cell assembly 1 along groove 81.

According to these steps, insulating layer 51 can be provided both at the ends of side surfaces of solar cell 10 formed by splitting solar cell assembly 1, and between first amorphous semiconductor layer 21p and first transparent conductive film 22. This makes it possible to suppress carrier movement both at the ends of side surfaces of solar cell 10 and between first amorphous semiconductor layer 21p and first transparent conductive film 22 when solar cell 10 functions as a photoelectric conversion device. A drop in the characteristics of solar cell 10 can therefore be suppressed.

Additionally, in the forming of groove 81, groove 81 may be formed through laser irradiation.

According to this step, groove 81 can be formed efficiently.

Additionally, in the forming of groove 81, groove 81 may be formed in second main surface 20b of semiconductor substrate 20.

According to this step, damage to first amorphous semiconductor layer 21p and first transparent conductive film 22 on the first main surface 20a side of semiconductor substrate 20 can be suppressed by using groove-based processing. This makes it possible to suppress a drop in the characteristics of solar cell 10.

Additionally, insulating layer 51 may be a carrier movement suppression layer that suppresses carrier movement between first amorphous semiconductor layer 21p and first transparent conductive film 22.

According to this configuration, carrier movement can be suppressed both at the ends of side surfaces of solar cell 10 and between first amorphous semiconductor layer 21p and first transparent conductive film 22 when solar cell 10 functions as a photoelectric conversion device. A drop in the characteristics of solar cell 10 can therefore be suppressed.

1-6. Variation 1 on Embodiment 1

Solar cell assembly 1 according to Variation 1 on Embodiment 1 will be described next. Variation 1 will describe an example in which opening 22a is provided in first transparent conductive film 22 of solar cell assembly 1.

Figure 12:
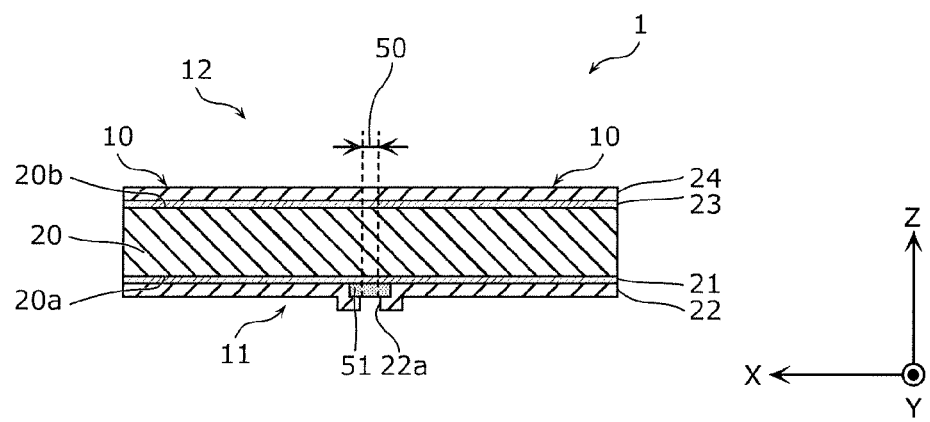
FIG. 12 is a cross-sectional view of a solar cell assembly according to Variation 1 on Embodiment 1.

FIG. 12 is a cross-sectional view of solar cell assembly 1 according to Variation 1.

In solar cell assembly 1 according to Variation 1, insulating layer 51 is provided between p-type semiconductor layer 21 and first transparent conductive film 22 in inter-cell region 50. To be more specific, insulating layer 51 is provided between first amorphous semiconductor layer 21p and first transparent conductive film 22.

Additionally, first transparent conductive film 22 has a slot-shaped opening 22a extending along inter-cell region 50. Opening 22a is formed through a thin film forming method using a mask or the like, or by ensuring that first transparent conductive film 22 does not come into close contact with insulating layer 51 when forming first transparent conductive film 22. Part of insulating layer 51 is exposed from opening 22a.

According to this configuration, in solar cell 10 manufactured by segmenting solar cell assembly 1, insulating layer 51 can be provided both at the ends of side surfaces of solar cell 10 and between first amorphous semiconductor layer 21p and first transparent conductive film 22. This makes it possible to suppress carrier movement both at the ends of side surfaces of solar cell 10 and between first amorphous semiconductor layer 21p and first transparent conductive film 22 when solar cell 10 functions as a photoelectric conversion device. A drop in the characteristics of solar cell 10 can therefore be suppressed.

Additionally, because there is a region where first transparent conductive film 22 is not formed on insulating layer 51, the carrier movement suppression function of insulating layer 51 can be enhanced, which makes it possible to make insulating layer 51 thinner. This makes it possible to shorten the time required to form insulating layer 51, which can improve productivity.

1-7. Variation 2 on Embodiment 1

Solar cell assembly 1 according to Variation 2 on Embodiment 1 will be described next. Variation 2 will describe an example in which both insulating layer 51 and first transparent conductive film 22 have openings.

Figure 13:
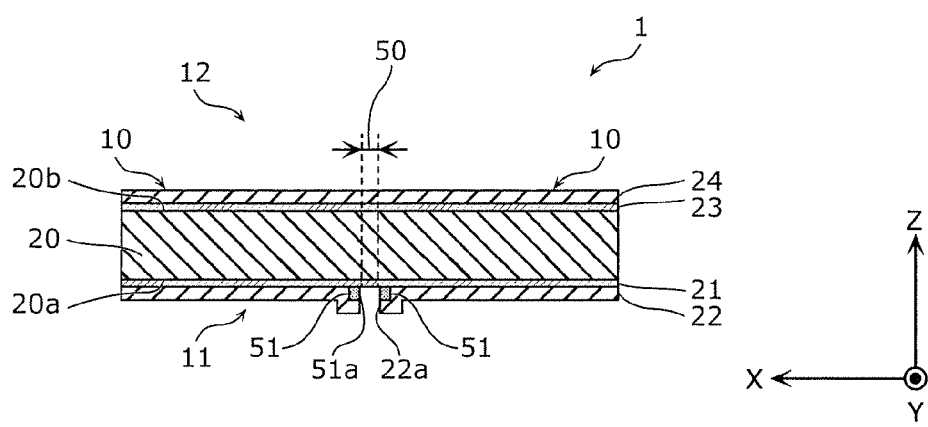
FIG. 13 is a cross-sectional view of a solar cell assembly according to Variation 2 on Embodiment 1.

FIG. 13 is a cross-sectional view of solar cell assembly 1 according to Variation 2.

In solar cell assembly 1 according to Variation 2 as well, insulating layer 51 is provided between p-type semiconductor layer 21 and first transparent conductive film 22 in inter-cell region 50. To be more specific, insulating layer 51 is provided between first amorphous semiconductor layer 21p and first transparent conductive film 22.

Additionally, insulating layer 51 has a slot-shaped opening 51a extending along inter-cell region 50, and first transparent conductive film 22 has a slot-shaped opening 22a having the same width as opening 51a. Openings 51a and 22a are formed through a thin film forming method using a mask or the like, or by separating part of insulating layer 51 from first transparent conductive film 22 and first amorphous semiconductor layer 21p located above that part when forming first transparent conductive film 22. Part of first amorphous semiconductor layer 21p is exposed from opening 51a and opening 22a.

According to this configuration, in solar cell 10 manufactured by segmenting solar cell assembly 1, insulating layer 51 can be provided both at the ends of side surfaces of solar cell 10 and between first amorphous semiconductor layer 21p and first transparent conductive film 22. This makes it possible to suppress carrier movement both at the ends of side surfaces of solar cell 10 and between first amorphous semiconductor layer 21p and first transparent conductive film 22 when solar cell 10 functions as a photoelectric conversion device. A drop in the characteristics of solar cell 10 can therefore be suppressed.

Additionally, because there is a region where insulating layer 51 is not formed, situations where splitting problems arise due to insulating layer 51 when splitting solar cell assembly 1 can be suppressed. This makes it possible to improve the yield of solar cells 10.

Embodiment 2

Solar cell assembly 1A according to Embodiment 2 will be described next. Embodiment 2 will describe an example in which solar cell 10A is a Tunnel Oxide Passivated Contact Cell (TOPCON) type rather than a heterojunction type.

Figure 14:
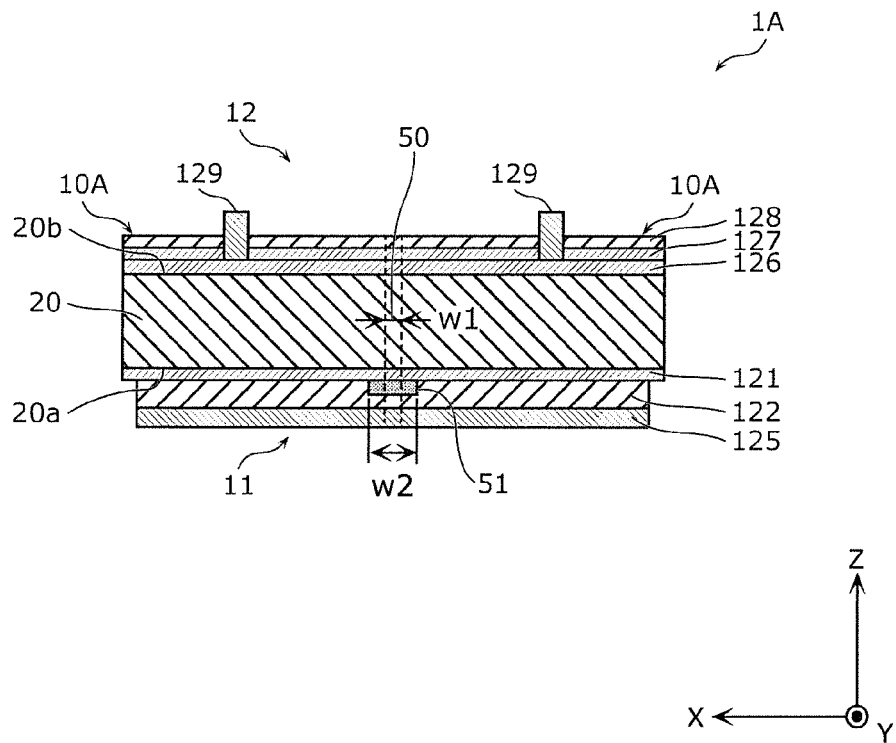
FIG. 14 is a cross-sectional view of a solar cell assembly according to Embodiment 2.

FIG. 14 is a cross-sectional view of solar cell assembly 1A according to Embodiment 2.

Solar cell assembly 1A according to Embodiment 2 includes a plurality of solar cells 10A, and inter-cell region 50 provided between solar cells 10A, of the plurality of solar cells 10A, that are adjacent to each other.

Each of solar cell 10A and inter-cell region 50 includes semiconductor substrate 20, tunnel oxide layer 121, insulating layer 51, polycrystal silicon layer 122, and silver electrode layer 125. Semiconductor substrate 20 is of the first conductivity type, and has first main surface 20a and second main surface 20b which face away from each other. Tunnel oxide layer 121 is provided on first main surface 20a side of semiconductor substrate 20. Insulating layer 51 is provided on part of tunnel oxide layer 121. Polycrystal silicon layer 122 is of the first conductivity type and is provided on tunnel oxide layer 121 so as to cover insulating layer 51. Silver electrode layer 125 is provided on polycrystal silicon layer 122. Polycrystal silicon layer 122 is, for example, a P (phosphorous)-doped polysilicon layer.

Additionally, solar cell assembly 1A includes B (boron)-doped emitter layer 126, $Al_2O_3$ layer 127, and SiNx layer 128. B-doped emitter layer 126 is of the second conductivity type and is provided on second main surface 20b of semiconductor substrate 20. $Al_2O_3$ layer 127 is provided on B-doped emitter layer 126. SiNx layer 128 is provided on $Al_2O_3$ layer 127. Front grid 129, which is connected to B-doped emitter layer 126, is provided on part of SiNx layer 128.

Insulating layer 51 is a carrier movement suppression layer that suppresses carrier movement between tunnel oxide layer 121 and polycrystal silicon layer 122 when solar cell 10A functions as a photoelectric conversion device.

Insulating layer 51 has a band shape, and extends along inter-cell region 50. Specifically, insulating layer 51 extends in a straight line in a direction orthogonal to the direction in which the plurality of solar cells 10A are arranged (the Y-axis direction). Additionally, when solar cell assembly 1A is viewed in plan view, insulating layer 51 is provided so as to partially overlap with inter-cell region 50. Specifically, width w2 of the band-shaped insulating layer 51 is greater than width w1 of inter-cell region 50, and insulating layer 51 is disposed so as to contain inter-cell region 50 in terms of a width direction (the X-axis direction).

In solar cell assembly 1A according to Embodiment 2, insulating layer 51 is provided in inter-cell region 50, between tunnel oxide layer 121 and polycrystal silicon layer 122. According to this configuration, carrier movement between tunnel oxide layer 121 and polycrystal silicon layer 122 when solar cell 10A functions as a photoelectric conversion device can be suppressed. This makes it possible to suppress a drop in the characteristics of solar cell 10A.

The configuration of solar cell 10A obtained by segmenting solar cell assembly 1A will be described next.

Figure 15:
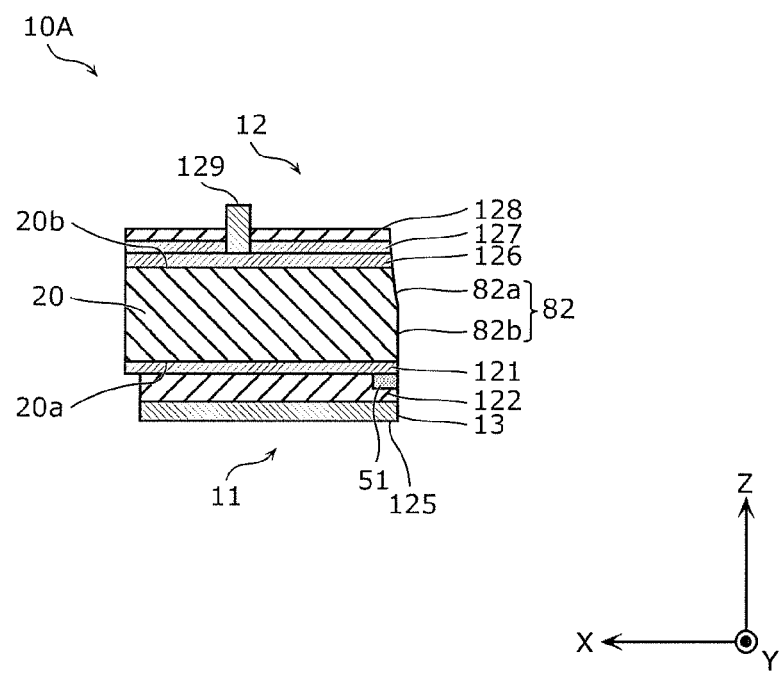
FIG. 15 is a cross-sectional view of a solar cell constituting part of the solar cell assembly according to Embodiment 2.

FIG. 15 is a cross-sectional view of solar cell 10A constituting part of solar cell assembly 1A.

As illustrated in FIG. 15, solar cell 10A includes semiconductor substrate 20, tunnel oxide layer 121, insulating layer 51, polycrystal silicon layer 122, and silver electrode layer 125. Semiconductor substrate 20 is of the first conductivity type. Tunnel oxide layer 121 is provided on first main surface 20a side of semiconductor substrate 20. Insulating layer 51 is provided on part of tunnel oxide layer 121. Polycrystal silicon layer 122 is of the first conductivity type and is provided on tunnel oxide layer 121 so as to cover insulating layer 51. Silver electrode layer 125 is provided on polycrystal silicon layer 122. Polycrystal silicon layer 122 is, for example, a P (phosphorous)-doped polysilicon layer.

Additionally, solar cell 10A includes B (boron)-doped emitter layer 126, $Al_2O_3$ layer 127, and SiNx layer 128. B-doped emitter layer 126 is provided on second main surface 20b of semiconductor substrate 20. $Al_2O_3$ layer 127 is provided on B-doped emitter layer 126. SiNx layer 128 is provided on $Al_2O_3$ layer 127. Front grid 129, which is connected to B-doped emitter layer 126, is provided on part of SiNx layer 128.

Solar cell 10A has segmented surface 82 formed by segmenting solar cell assembly 1A. Segmented surface 82 has notch surface 82a formed by a laser, and splitting surface 82b formed by cutting.

Insulating layer 51 is provided between tunnel oxide layer 121 and polycrystal silicon layer 122. Insulating layer 51 is also provided on one end part 13 where, of the four ends of solar cell 10A, segmented surface 82 is formed, and is exposed on splitting surface 82b.

In this manner, in solar cell 10A, insulating layer 51 is provided at one end part 13 of solar cell 10A, between tunnel oxide layer 121 and polycrystal silicon layer 122. According to this configuration, insulating layer 51 can be provided both at one end part 13 of solar cell 10A and between tunnel oxide layer 121 and polycrystal silicon layer 122. According to this configuration, carrier movement both at one end part 13 of solar cell 10A between tunnel oxide layer 121 and polycrystal silicon layer 122 when solar cell 10A functions as a photoelectric conversion device can be suppressed. A drop in the characteristics of solar cell 10A can therefore be suppressed.

OTHER EMBODIMENTS

A solar cell assembly and the like according to the present disclosure have been described based on embodiments. However, the present disclosure is not limited to the foregoing embodiments.

For example, although an example in which inter-cell region 50 is provided continuously along inter-cell region 50 has been described, insulating layer 51 is not limited to this configuration, and may instead be provided intermittently in a broken-line form.

An example in which solar cell assembly 1 includes two solar cells 10 has been described, but the number of solar cells 10 is not limited to two. The solar cell assembly may include three solar cells and two inter-cell regions. Or, the solar cell assembly may include four solar cells and three inter-cell regions. Alternatively, the solar cell assembly may include a plurality of solar cells disposed in a matrix, and a plurality of inter-cell regions provided between adjacent ones of the solar cells.

Although FIG. 3 illustrates an example in which insulating layer 51 is provided in inter-cell region 50 located between two solar cells 10, the location of insulating layer 51 is not limited to this example. Insulating layer 51 may be provided at both ends of solar cell 10 in the direction in which solar cells 10 are arranged (the X-axis direction).

Although the foregoing embodiments describe examples in which an n-type semiconductor layer is formed on the light-receiving surface-side surface of the solar cell, the semiconductor layer is not limited to this configuration, and a p-type semiconductor layer may be formed on the light-receiving surface-side surface of the solar cell.

Although the foregoing embodiments describe an example in which i-type amorphous semiconductor layer 21i, which is a passivation layer, is provided between semiconductor substrate 20 and first amorphous semiconductor layer 21p, it is not absolutely necessary for i-type amorphous semiconductor layer 21i to be provided. Additionally, although the foregoing embodiments describe an example in which i-type amorphous semiconductor layer 23i, which is a passivation layer, is provided between semiconductor substrate 20 and second amorphous semiconductor layer 23n, it is not absolutely necessary for i-type amorphous semiconductor layer 23i to be provided.

Although the foregoing embodiments describe an example in which the first collecting electrode includes finger electrodes and busbar electrodes, the first collecting electrode is not limited to this configuration. It is sufficient for the first collecting electrode to include at least finger electrodes. Additionally, although the foregoing embodiments describe an example in which the second collecting electrode includes finger electrodes and busbar electrodes, the second collecting electrode is not limited to this configuration. It is sufficient for the second collecting electrode to include at least finger electrodes. In this case, the finger electrodes may be directly connected by the tab lines.

Although the foregoing embodiments describe an example in which groove 81 is formed by a laser, the formation method is not limited to using a laser, and groove 81 may be formed through processing with a blade or the like instead.

Additionally, the order of the steps in the method of manufacturing a solar cell described in the foregoing embodiments is merely an example, and is not limited to the order described. The order of steps may be switched, and parts of some steps may be omitted as well.

Additionally, each step in the method of manufacturing a solar cell described in the foregoing embodiments may be carried out in a single step, or may be carried out through different steps. Note that "carried out in a single step" is intended to include each step being carried out using a single device, each step being carried out in sequence, or each step being carried out at the same location. "Carried out through different steps" is intended to include each step being carried out using a different device, each step being carried out at a different time (e.g., on a different day), or each step being carried out at a different location.

Additionally, embodiments achieved by one skilled in the art making various conceivable variations on the embodiments, embodiments achieved by combining constituent elements and functions from the embodiments as desired within a scope which does not depart from the spirit of the present disclosure, and the like are also included in the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A solar cell assembly, comprising:
a plurality of solar cells; and
an inter-cell region provided between adjacent ones of the solar cells included in the plurality of solar cells,
wherein each of the solar cells and the inter-cell region includes:
a semiconductor substrate having a first conductivity type and having a first main surface and a second main surface that face away from each other;
a first amorphous semiconductor layer having a second conductivity type and being provided on a first main surface side of the semiconductor substrate;
an insulating layer provided on part of the first amorphous semiconductor layer; and
a first transparent conductive film provided on the first amorphous semiconductor layer so as to cover the insulating layer, and
in a plan view of the solar cell assembly, the insulating layer is provided along the inter-cell region and partially overlapping the inter-cell region, and in a cross-sectional view of the solar cell assembly, the insulating layer is positioned between the first amorphous semiconductor layer and the first transparent conductive film, and
the semiconductor substrate is from 30 μm to 300 μm thick.

2. The solar cell assembly according to claim 1,
wherein each of the solar cells and the inter-cell region further includes:
a second amorphous semiconductor layer having the first conductivity type and being provided on a second main surface side of the semiconductor substrate; and a second transparent conductive film provided on the second amorphous semiconductor layer.

3. The solar cell assembly according to claim 1, wherein in a plan view of the solar cell assembly, the insulating layer is band-shaped.

4. The solar cell assembly according to claim 3, wherein a width of the insulating layer, which is band-shaped, is greater than a width of the inter-cell region.

5. The solar cell assembly according to claim 4, wherein a length of the insulating layer, which is band-shaped, is greater than a length of the first transparent conductive film.

6. The solar cell assembly according to claim 3, wherein when viewed from a direction in which the insulating layer extends in a band shape, the first transparent conductive film completely covers the insulating layer.

7. The solar cell assembly according to claim 3,
wherein the first transparent conductive film has an opening having a slot shape and extending along the inter-cell region, and
part of the insulating layer is exposed from the opening.

8. The solar cell assembly according to claim 3, wherein each of the first transparent conductive film and the insulating layer has an opening having a slot shape and extending along the inter-cell region.

* * * * *